(12) United States Patent
Goshima et al.

(10) Patent No.: US 8,987,376 B2
(45) Date of Patent: Mar. 24, 2015

(54) POLYIMIDE RESIN COMPOSITION FOR SEMICONDUCTOR DEVICES, METHOD OF FORMING FILM IN SEMICONDUCTOR DEVICES USING THE SAME AND SEMICONDUCTOR DEVICES

(75) Inventors: Toshiyuki Goshima, Yokohama (JP); Sigemasa Segawa, Yokohama (JP); Maw Soe Win, Yokohama (JP); Junichi Yamashita, Tokyo (JP); Ken Takanashi, Tokyo (JP)

(73) Assignees: PI R&D Co., Ltd., Kanagawa (JP); Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 13/035,536

(22) Filed: Feb. 25, 2011

(65) Prior Publication Data
US 2011/0213075 A1    Sep. 1, 2011

(30) Foreign Application Priority Data
Feb. 26, 2010   (JP) ................................ 2010-043166

(51) Int. Cl.
*C08G 69/26* (2006.01)
*C08G 73/10* (2006.01)
*C08L 79/08* (2006.01)
*C09D 179/08* (2006.01)
*H01L 23/31* (2006.01)

(52) U.S. Cl.
CPC .......... *C08G 73/1042* (2013.01); *C08G 73/106* (2013.01); *C08L 79/08* (2013.01); *C09D 179/08* (2013.01); *H01L 23/3157* (2013.01); *H01L 2924/09701* (2013.01); *H01L 2924/19041* (2013.01); *H01L 2924/0002* (2013.01)
USPC ........... 524/606; 524/588; 524/600; 438/127; 257/E21.502

(58) Field of Classification Search
USPC ..................... 524/600, 79; 528/310
See application file for complete search history.

(56) References Cited

U.S. PATENT DOCUMENTS

| | | | | |
|---|---|---|---|---|
| 5,686,525 | A | * 11/1997 | Maruta et al. | ................. 524/600 |
| 2008/0275181 | A1 | * 11/2008 | Win et al. | ...................... 524/600 |
| 2011/0257623 | A1 | * 10/2011 | Marshall et al. | ............. 604/500 |
| 2012/0225033 | A1 | * 9/2012 | van Osdol et al. | ........... 424/85.7 |

FOREIGN PATENT DOCUMENTS

| | | |
|---|---|---|
| DE | 40 13 435 A1 | 12/1990 |
| DE | 44 10 354 A1 | 10/1995 |
| EP | 0 400 178 B1 | 8/1994 |
| EP | 1 145 845 B1 | 4/2010 |
| JP | 2-289646 A | 11/1990 |
| JP | 11-100517 A | 4/1999 |
| JP | 11-106664 A | 4/1999 |
| JP | 2000-154346 A | 6/2000 |
| WO | WO 00/41884 A1 | 7/2000 |

OTHER PUBLICATIONS

Yaws, Carl L., Critical Property Data for Chemical Engineers and Chemists, 2012, Table 12 No. 563 and 3786.*

* cited by examiner

*Primary Examiner* — Susannah Chung
*Assistant Examiner* — Robert T Butcher
(74) *Attorney, Agent, or Firm* — Birch, Stewart, Kolasch & Birch, LLP

(57) ABSTRACT

Disclosed is a polyimide composition for semiconductor devices, which has a rheological characteristics suited for screen printing and dispense coating, which has an improved wetting property with various coating bases, by which continuous printing of 500 times or more can be attained, with which blisters, cissing and pinholes are not generated after printing and drying or during drying or curing, which can coat a desired area. A method of forming a film in a semiconductor and semiconductors having the film formed by this method as an insulation film, protective film or the like are also disclosed. The composition for semiconductor devices contains a mixed solvent of a first organic solvent (A) and a second organic solvent (B); and a polyimide resin having at least one group selected from the group consisting of alkyl groups and perfluoroalkyl groups in recurring units, and having thixotropic property, the polyimide resin being dissolved in the mixed solvent.

9 Claims, No Drawings

POLYIMIDE RESIN COMPOSITION FOR SEMICONDUCTOR DEVICES, METHOD OF FORMING FILM IN SEMICONDUCTOR DEVICES USING THE SAME AND SEMICONDUCTOR DEVICES

TECHNICAL FIELD

The present invention relates to a polyimide resin composition for semiconductor devices, method of forming a film in semiconductor devices using the same and semiconductor devices.

BACKGROUND ART

Heat-resistant resins typified by polyimide resins have been widely used as surface protective layers and interlayer insulation films in semiconductor elements in the electronics field because of their excellent heat resistance and mechanical properties. Patent Literatures 1 and 2 disclose in detail processes for producing primary passivation layers and secondary passivation layers formed on surfaces in power semiconductor elements.

In recent years, with the compaction, thinning and high integration of semiconductor devices, insulation and protection of small areas became necessary and formation of protective layers and the like having a precise pattern is demanded. That is, formation of layers became necessary which give protection from α-ray and external stresses such as the pressure applied during resin molding, which became great enemy of semiconductor devices because of the increased precision of the semiconductor devices. As for flash memories, necessity of protective layers is increasing because of the increasing capacity thereof. On the other hand, as for the protective layers themselves, with the thinning of semiconductor wafers in recent years, in order to prevent the warping during the formation of protective films, demands for using a low-stress protective material and/or process of forming a protective film only on the required area in the semiconductor are increasing.

In the conventional production techniques, a method of forming a protective layer in a semiconductor device in which a polyamic acid or a polyimide resin varnish for protective layers is coated by spin coating method to form a thin film has been used in practice. However, this method has a problem in that it is difficult to control the film thickness to a thickness of not less than 10 μm, although a thin film with a thickness of several micrometers can be easily formed. Further, with this method, only a part of the fed material is used for forming the film, and most of the fed material is discarded, so that the yield of the method is very low. Still further, this method has a problem in that it cannot form a thin layer only on the necessary area. Therefore, an additional patterning step for forming a desired pattern, such as photolithography is necessary for forming the thin film only on the necessary area, which is complicated.

Still further, in most cases, the polyimide resin used for forming the polyimide layer is in the form of a polyamic acid. To convert the polyamic acid to polyimide, a step of heating the coated thin film to ring-close (imidize) the polyamic acid is necessary. As a result, the method has a problem in the processability, such as the shrinkage of the resin during the imidization reaction is large, so that it is difficult to form a resin protective layer with a precise pattern particularly on a semiconductor wafer or the like.

A method of forming a resin pattern by exposure with light using a photosensitive polyimide resin has also been proposed. However, this method has a problem in that the photosensitizing material is limited and expensive, and the method may not be used in wet system. Further, in many cases, in power semiconductor elements, the outgas components attach to the metal layers which are to be connected mainly by solder, so that the wettability of the solder is decreased. As a result, there is a concern that the reliability of the product may be reduced, so that the photosensitizing material cannot be used.

Recently, as the methods of forming images of polyimide resin films used as surface protective films, interlayer insulation films, stress buffers and the like, screen printing method and dispense method are attracting attention. These methods do not require complicated steps such as exposure, development, etching and the like, and films can be formed only on the necessary portions on wafers. As a result, a large cost saving can be attained.

Patent Literature 3 discloses, as a method of forming a protective film on the surface of a semiconductor wafer, a method of coating the surface of the wafer with a paste for printing by screen printing method. The paste is composed of a polyimide which is a base resin, an inorganic filler such as silica, and a solvent. The inorganic filler is added for giving thixotropic property, so as to prevent the sagging and bleeding during printing. However, since a large amount of the inorganic filler is added, there is a tendency that problems in that the film strength is decreased, adhesion with the substrate is decreased and the like arise. Further, since N-methyl-2-pyrrolidone (NMP) is used as the solvent, paste and the screen are largely influenced. That is, due to moisture absorption by NMP, the viscosity of an NMP-containing paste changes and in a severe case, even the resin component is precipitated. Once the resin component precipitates, mesh of the screen is clogged, and when the viscosity change occurs, the printing conditions change with time, so that stable printing cannot be attained. As for the screen, since the resistance of the emulsion to NMP is low, dimensional change of the pattern and skipping and chipping of small pattern occur, which give bad influence on the products. These problems are more and more severe as the pattern is finer and finer. The above-described problems of NMP cannot be solved by decreasing the NMP content, and in many cases, even when the NMP content is considerably small, NMP gives influence. As a result, there is a tendency that the NMP-containing paste is a special paste which can be handled only by a skilled person who thoroughly knows the characteristics of the paste.

To solve the problems caused by the inorganic fillers, Patent Literatures 4 to 6 propose heat-resistant resin pastes by which polyimide patterns having excellent properties can be formed by composing the resin composition with a special organic filler which melts during heating and drying, is dissolved in the base resin and forms the film together with the base resin (i.e., soluble filler), a base resin and a solvent. However, since the viscosity at 25° C. is 100 to 10,000 Pa·s, which is relatively high, there is a problem in that the screen mesh is not easily detached from the wafer, so that continuous printing is difficult.

PRIOR ART REFERENCES

Patent Literatures

[Patent Literature 1] DE 4013435 A1
[Patent Literature 2] DE 4410354 A1
[Patent Literature 3] JP 2000-154346 A
[Patent Literature 4] JP 2-289646 A
[Patent Literature 5] JP 11-100517 A

[Patent Literature 6] JP 11-106664 A
[Patent Literature 7] WO 00/41884

SUMMARY OF THE INVENTION

Problems to be Solved by the Invention

An object of the present invention is to provide a polyimide composition for semiconductor devices, which has a rheological characteristics suited for screen printing and dispense coating, which has an improved wetting property with various substrates to be coated ($SiO_2$, SiN, Si, Al, Au and the like), by which continuous printing of 500 times or more can be attained, with which blisters, cissing and pinholes are not generated after printing and drying or during drying or curing, and which can coat a desired area, as well as to provide a method of forming a film in a semiconductor, and semiconductors having the film formed by this method as an insulation film, protective film or the like.

Means for Solving the Problems

The present inventors intensively studied to discover that a polyimide resin which is soluble in a mixed solvent free from the problems of moisture absorption and evaporation during coating in screen printing method and dispense method can be obtained by appropriately designing the constitution of the polyimide, and that a composition containing this polyimide in the mixed solvent has an excellent rheological characteristics and excellent pattern-forming property, and does not cause a problem such as poor patterning even after various steps such as drying, thereby completing the present invention.

That is, the present invention provides a polyimide resin composition for semiconductor devices, said composition comprising: a mixed solvent of a first organic solvent (A) and a second organic solvent (B); and a polyimide resin having at least one group selected from the group consisting of alkyl groups and perfluoroalkyl groups in recurring units, and having thixotropic property, said polyimide resin being dissolved in said mixed solvent. The present invention also provides a method of forming a polyimide film in a semiconductor device, said method comprising coating a base layer in said semiconductor device with said composition according to the present invention. The present invention further provides a semiconductor device comprising the polyimide film formed by the method according to the present invention.

Effects of the Invention

The composition for semiconductor devices according to the present invention can be coated by screen printing method or dispense method, has excellent rheological characteristics, and has excellent wetting property with substrates and excellent pattern-forming property and continuous printing property. The coating films formed with the resin composition of the present invention can be used as insulation films, protective films and the like in semiconductor devices, which have excellent adhesion with substrates, and have excellent electric properties, heat-resistance and chemical resistance.

MODE FOR CARRYING OUT THE INVENTION

The polyimide contained in the polyimide composition of the present invention is one which can be obtained by dissolving a tetracarboxylic dianhydride(s) and a diamine(s) in an organic solvent, and carrying out direct imidization (i.e., without through a polyamic acid) in the presence of an acid catalyst. The polyimide can also be produced by reacting a tetracarboxylic dianhydride and a diamine in an organic solvent, and then adding at least one of a tetracarboxylic dianhydride and a diamine so as to carrying out imidization (the production process will be described later).

In cases where it is desired to promote the thixotropic property so as to attain a fine pattern printing by the addition of an inorganic filler, the amount of the added inorganic filler is inevitably increased. As a result, there arises a concern about adhesion. Thus, in designing the solvent-soluble polyimide, the fine pattern-forming property and adhesion should be taken into consideration. After intensive study, the present inventors discovered that if the polyimide has at least one of alkyl groups and perfluoro alkyl groups in the recurring units thereof, excellent fine pattern-forming property and adhesion are obtained, and the polyimide can be suitably used for attaining the object of the present invention.

That is, in general, polyimides are the compounds wherein recurring units represented by Formula [V] below are bound. The polyimide used in the present invention has at least one of alkyl groups and perfluoroalkyl groups in at least one of $R^1$ and $R^2$. The carbon number in this alkyl group and perfluoroalkyl group is preferably 1 to 4, more preferably 1.

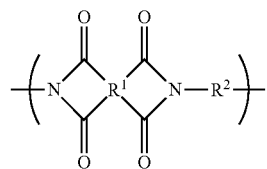

[V]

wherein $R^1$ and $R^2$ each independently represents a divalent organic group, preferably an aromatic organic group in view of heat resistance.

Preferred examples of the structures having the above-described at least one of alkyl groups and perfluoroalkyl groups include the divalent groups represented by the following Formulae [I] to [IV]. That is, those having at least one divalent group represented by any of the following Formulae [I] to [IV] in its main chain, that is in at least one of $R^1$ and $R^2$ are preferred in view of obtaining excellent fine pattern-forming property and adhesion.

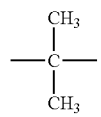

[I]

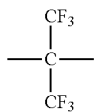

[II]

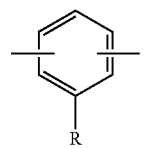

[III]

wherein R represents a $C_1$-$C_4$ alkyl group

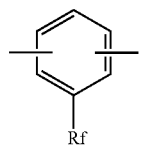

[IV]

wherein Rf represents a $C_1$-$C_4$ perfluoroalkyl group

Preferred examples of the tetracarboxylic dianhydride containing the structure represented by the above-described Formula [I] include 2,2-bis(3,4-dicarboxyphenyl)propane dianhydride and 4,4'-(4,4'-isopropylidenediphenoxy)bisphthalic dianhydride. Preferred examples of the diamine containing the structure represented by the above-described Formula [I] include 2,2-bis(4-aminophenyl)propane, 2,2-bis(3-hydroxy-4-aminophenyl)propane, 2,2-bis(3-methyl-4-aminophenyl)propane, 2,2-bis[4-(4-aminophenoxy)phenyl]propane, α,α-bis(4-aminophenyl)-1,3-diisopropylbenzene, α,α-bis[4-(4-aminophenoxy)phenyl]-1,3-diisopropylbenzene, α,α-bis(4-aminophenyl)-1,4-diisopropylbenzene and α,α-bis[4-(4-aminophenoxy)phenyl]-1,4-diisopropylbenzene.

Preferred examples of the tetracarboxylic dianhydride containing the structure represented by the above-described Formula [II] include 2,2-bis(3,4-dicarboxyphenyl)hexafluoropropane dianhydride. Preferred examples of the diamine containing the structure represented by the above-described Formula [II] include 2,2-bis(4-aminophenyl)hexafluoropropane, 2,2-bis[4-(4-aminophenoxy)phenyl]hexafluoropropane, 2,2-bis(3-amino-4-methylphenyl)hexafluoropropane and 2,2-bis(3-amino-4-hydroxyphenyl)hexafluoropropane.

Preferred examples of the diamine containing the structure represented by the above-described Formula [III] include 2,4-diaminotoluene, 4,4'-diamino-2,2'-dimethyl-1,1'-biphenyl, 4,4'-diamino-3,3'-dimethyl-1,1'-biphenyl, 9,9'-bis(3-methyl-4-aminophenyl)fluorene and 3,7-diamino-dimethyldibenzothiophene 5,5-dioxide.

Preferred examples of the diamine containing the structure represented by the above-described Formula [IV] include 4,4'-diamino-2,2'-ditrifluoromethyl-1,1'-biphenyl and 4,4'-diamino-3,3'-ditrifluoromethyl-1,1'-biphenyl.

As the tetracarboxylic dianhydride and diamine constituting the polyimide used in the present invention, in addition to the above-described at least one of tetracarboxylic dianhydrides and diamines containing at least one of alkyl groups and perfluoroalkyl groups, one or more of other tetracarboxylic dianhydrides and diamines is usually used in order to give various functions such as heat resistance, electric properties, physical properties of the film, adhesion and the like.

Examples of such tetracarboxylic dianhydride include pyromellitic dianhydride, 3,3',4,4'-biphenyltetracarboxylic dianhydride, bis(3,4-dicarboxyphenyl)ether dianhydride, 3,3',4,4'-benzophenone tetracarboxylic dianhydride, 3,3',4,4'-biphenylsulfone tetracarboxylic dianhydride and bicyclo[2.2.2]oct-7-ene-2,3,5,6-tetracarboxylic dianhydride. Among these tetracarboxylic dianhydrides, bis(3,4-dicarboxyphenyl)ether dianhydride and 3,3',4,4'-biphenylsulfone tetracarboxylic dianhydride can suitably be employed in view of the solubility. These tetracarboxylic dianhydrides may be used individually or two or more of them may be used in combination.

Examples of the diamines include m-phenylenediamine, p-phenylenediamine, 4,4'-diamino-3,3'-dihydroxy-1,1'-biphenyl, 3,4'-diaminodiphenyl ether, 4,4'-diaminodiphenyl ether, 3,3'-diaminodiphenyl sulfone, 4,4'-diaminodiphenyl sulfone, 4,4'-diaminodiphenyl sulfide, 1,3-bis(3-aminophenoxy)benzene, 1,3-bis(4-aminophenoxy)benzene, 1,4-bis(4-aminophenoxy)benzene, 4,4'-bis(4-aminophenoxy)biphenyl, bis[4-(3-aminophenoxy)phenyl]sulfone, bis[4-(4-aminophenoxy)phenyl]sulfone, 3,5-diaminobenzoic acid, 2,6-diaminopyridine and 4,4'-(9-fluolenylidene)dianiline. These diamines may be used individually or two or more of them may be used in combination.

The polyimide used in the present invention is usually obtained by using the above-described at least one of tetracarboxylic dianhydrides and diamines having at least one of alkyl groups and perfluoroalkyl groups, and at least one of the other tetracarboxylic dianhydrides and diamines described above in combination. Among the tetracarboxylic dianhydride components and diamine components constituting the polyimide, the percentage of the components having at least one of alkyl groups and perfluoroalkyl groups is usually from 10 mol % to 80 mol %, preferably 20 mol % to 60 mol %. If the percentage of the components having at least one of alkyl groups and perfluoroalkyl groups is within this range, excellent fine pattern-forming property and adhesion are obtained.

In cases where the substrate is a nitride film, there is a tendency that the adhesion between the aromatic polyimide and the substrate is poor. Therefore, it is preferred to use 1,3-bis(3-aminopropyl)tetramethyldisiloxane as one of the diamine components. This diamine is most preferred because it is commercially available from Shin-Etsu Chemical under the trade name PAM-E and from Toray Dow Corning under the trade name BY16-871. The added amount of this diamine is preferably from 1 mol % to 20 mol %, more preferably from 3 mol % to 15 mol % based on the total diamines. If the amount is more than 20 mol %, there is a tendency that the glass transition point of the polyimide resin is too low, and a problem may arise during the continuous operation of the semiconductor substrate at a high temperature.

To promote the chemical resistance, a reactive group may be introduced to the terminal(s) of the polyimide. For example, by adding the tetracarboxylic dianhydride in an amount slightly higher than the required amount, it is possible to make the terminals of the polyimide be the dianhydride. Thereafter, by adding an amine compound typified by 3-ethylaniline and 4-ethylaniline, acetyl groups can be introduced to the terminals of the polyimide. Similarly, reactive groups can be introduced by synthesizing the polyimide adding the diamine in an amount slightly higher than the required amount to obtain a polyimide whose terminals are the diamine, and then adding an acid anhydride typified by maleic anhydride, ethynylphthalic anhydride and phenylethynylphthalic anhydride. These terminal groups are reacted under heat at a temperature of 150° C. or higher so as to crosslink the polymer main chain.

The polyimide contained in the polyimide resin composition of the present invention can be produced by a known method in which the tetracarboxylic dianhydride and the diamine are dissolved in an organic solvent and they are directly imidized in the presence of an acid catalyst. The polyimide can also be produced by reacting the tetracarboxylic dianhydride with the diamine in the organic solvent, then adding at least one of a tetracarboxylic dianhydride and a diamine, and carrying out imidization. The mixing ratio of the tetracarboxylic dianhydride to the diamine is preferably such that the total amount of the diamines is 0.9 to 1.1 mol per 1 mol of the total amount of the tetracarboxylic dianhydrides. As the acid catalyst, a catalyst such as acetic anhydride/triethylamine system, valerolactone/pyridine system or the like for chemical imidization may preferably be employed. The reaction temperature is preferably from 80° C. to 250° C., and the reaction time can be appropriately selected depending on the scale of the batch and the reaction conditions employed. Further, block polyimide copolymers obtained by dividing the imidization reaction into two or more steps, and reacting different tetracarboxylic dianhydrides and/or diamines in the respective steps, may preferably be employed. The production processes per se of the solvent-soluble block polyimide copolymers are known as described in, for example, Patent Literature 7, and the polyimide suitably used in the present invention can be synthesized by a known method using the above-described tetracarboxylic dianhydride(s) and/or diamine(s).

The number average molecular weight of the thus obtained polyimide resin is preferably 6,000 to 60,000, more preferably 7,000 to 50,000. If the number average molecular weight is less than 6,000, the physical properties of the film such as breaking strength are tend to be degraded, and if it is more than 60,000, the viscosity is high and so the problem of cobwebbing arises, so that it is difficult to obtain a varnish suited for printing and coating. The number average molecular weight herein means the one in terms of polystyrene based on the calibration curve prepared with a gel permeation chromatography (GPC) apparatus using standard polystyrenes.

The solvent contained in the composition of the present invention is a mixed solvent of a first organic solvent (A) and a second organic solvent (B). It is preferred that the solvents have different evaporation rates, and the solubility of the polyimide in the solvent having a lower evaporation rate is preferably lower than in the solvent having a higher evaporation rate. If these are satisfied, the sagging of the pattern during drying can be avoided, and so the pattern immediately after the coating can be retained. Since the solubilities in various solvents differ depending on the composition of the polyimide, it is not restricted whether the organic solvent (A) or organic solvent (B) has a higher evaporation rate. The evaporation rate of the solvents can be measured by using a commercially available differential thermogravimetric simultaneous analyzer and measuring the weight loss. In the Examples below, the evaporation rate is measured by using TG-DTA 2000S commercially available from MAC. Science Co., Ltd., under the conditions of $N_2$ flow rate: 150 ml/min; temperature: 40° C., sample amount: 20 μL; the sample is dropped onto a cup having an opening with a diameter of 5 mm.

The first organic solvent (A) is preferably a hydrophobic solvent (that is, a solvent practically insoluble in water), and preferably is a solvent having a vapor pressure at room temperature of 1 mmHg or lower. Specific examples of the first organic solvent (A) include benzoic acid esters such as methyl benzoate and ethyl benzoate; acetic acid esters such as benzyl acetate, butyl carbitol acetate; and ethers such as diethyleneglycol dibutyl ether. By using a solvent practically insoluble in water, whitening (precipitation phenomenon of polyimide) and viscosity change due to moisture absorption hardly occur especially in the screen printing. Further, if the vapor pressure at room temperature is higher than 1 mm Hg, the screen tends to be dried in the screen printing, so that the continuous printing property tends to be degraded.

The second organic solvent (B) is preferably a hydrophilic solvent (that is, a solvent miscible with water), and preferably is a solvent having a vapor pressure at room temperature of 1 mmHg or lower. Specific examples of the second organic solvent (B) include acetic acid esters such as diethylene glycol monoethyl ether acetate; glymes such as triglyme and tetraglyme; ethers such as tripropylene glycol dimethyl ether and diethylene glycol diethyl ether; and sulfolane. The term "miscible with water" is used for clearly indicating that a solvent having a vapor pressure and properties different from those of the first organic solvent (A) is used, and the second solvent (B) is not necessarily miscible with water. However, since good solvent varies depending on the various starting materials and the composition of the synthesized polyimide, the solvent to be combined with the practically water-insoluble organic solvent (A) is preferably a water-miscible solvent because the freedom of selection is larger. The reason why the vapor pressure of the organic solvent (B) at room temperature is 1 mmHg or lower is the same as described above for the organic solvent (A).

The mixing ratio of the first organic solvent (A) to the second organic solvent (B) is preferably such that the percentage of the first organic solvent (A) is from 30% by weight to 80% by weight based on the whole mixed solvent. If the percentage of the first organic solvent (A) is less than 30% by weight, the hydrophobicity of the solvent is not sufficient, so that whitening and viscosity change during the screen printing tend to occur.

To control the evaporation rate or to adjust the viscosity during the preparation of the resin composition, a diluent may also be used. Examples of the diluent include lactone solvents such as γ-butyrolactone; ketone solvents such as cyclohexanone; carbonate solvents such as ethylene carbonate and propylene carbonate. Using a diluent is effective especially in cases where the pattern to be formed is sufficiently large or the continuous printing property need not be so high, because the solubility of the polyimide is increased and the shelf stability is improved. The most recommended solvent is γ-butyrolactone, and this solvent may also be used in the synthesis of the polyimide.

The content of the polyimide resin solid in the composition of the present invention is preferably from 15% to 60% by weight, more preferably from 25% to 50% by weight. If the solid content is less than 15% by weight, the thickness of the film which can be formed by the printing and coating in one time is small, so that two or more times of printing and coating tend to be required. If the solid content is more than 60% by weight, the viscosity of the resin composition tends to be too high.

As described later, the resin composition of the present invention has a thixotropic property. Since the thixotropic property can be given by adding an inorganic filler, it is effective to add an inorganic filler to the resin composition of the present invention. Examples of the inorganic filler for giving thixotropic property include at least one of silica, alumina and titania. More specifically, examples of the inorganic filler include at least one of amorphous silica with a size of 0.01 μm to 0.03 μm and spherical silica, alumina and titania with a diameter of 0.1 μm to 0.3 μm. To promote shelf stability and the like, it is preferred to use an inorganic filler treated with a trimethylsilylating agent. The content of the inorganic filler in the composition is usually 0% to 50% by weight, preferably 2% to 30% by weight. If the content of the inorganic filler is within this range, appropriate thixotropic property is imparted.

Additives such as a coloring agent, antifoaming agent, leveling agent, adhesion-promoting agent and the like may be added to the polyimide resin composition of the present invention as long as the product is not adversely affected. Examples of the coloring agent include phthalocyanine blue, phthalocyanine green, iodine green, disazo yellow, crystal violet, titanium oxide, carbon black and naphthalene black. Antifoaming agents are used for extinguishing the foams generated in the printing, coating and curing steps. As the antifoaming agent, surfactants such as acrylic surfactants and silicone surfactants may be employed. Examples of the antifoaming agent include "BYK-051" of BYK Chemi; "DC- 1400" of Dow Corning; and silicone antifoaming agents such as SAG-30, FZ-328, FZ-2191 and FZ-5609 of Nippon Unicar Co., Ltd. Leveling agents are used for eliminating the irregularities on the surface of the coating layer, which irregularities are formed during the printing and coating. More particularly, a surfactant in an amount of about 100 ppm to about 2% by weight is preferably added. By adding an acrylic, silicone or the like leveling agent, generation of foams can be reduced and the coating layer can be smoothened. Preferred leveling agents are anionic one not containing ionic impurities. Appropriate examples of the surfactant include "FC-430" of 3M; "BYK-051" of BYK Chemi; and Y-5187, A-1310 and SS-2801 to 2805 of Nippon Unicar Co., Ltd. Examples of the adhesion-promoting agent include imidazole compounds, thiazole compounds, triazole compounds, organic aluminum compounds, organic titanium compounds and silane coupling agents. The additives described above are preferably contained in an amount of 10 parts by weight or less based on 100 parts by weight of the polyimide resin component. If the amount of the above-described additives is more than 10 parts by weight, the physical properties of the obtained film tend to be degraded, and a problem of the pollution by the volatile components arises. Therefore, it is most preferred not to add the above-described additives.

The viscosity at 25° C. of the polyimide resin composition of the present invention is preferably 20,000 to 200,000 mPa·s, more preferably 30,000 to 50,000 mPa·s, still more preferably 35,000 to 40,000 mPa·s. If the viscosity is less than 20,000 mP·s, sagging or the like is likely to occur, and a sufficient film thickness and resolution cannot be obtained. If the viscosity is higher than 200,000 mPa·s, transferring property and ease of handling in printing tend to be degraded. The value of the viscosity is expressed in terms of apparent viscosity measured by using a rheometer at a revolution of 100 rad/s.

The value of the viscosity is important for not only retaining the shape of the coating layer immediately after coating, but also for the flowability, that is, the property to be easily deformed and flowed by the squeegee during the screen printing. In the screen printing, if the viscosity is high, the rolling of the resin composition may be hindered, so that the coating with a scraper may be insufficient and irregularities in coating and deformation tend to easily occur.

If an ink does not have a shape-retaining property to retain the shape of the coating layer immediately after coating in a desired pattern by the screen printing or the like, blur and sagging occur in the circumference of the pattern occurs, so that a thick film cannot be formed with a high resolution. By simply increasing the viscosity, although the sagging or the like can be inhibited, the problem in the detachment from the screen in the screen printing and problem in the irregularities in the coating film arise. Thus, to prevent the generation of blur and sagging, thixotropy coefficient is important. Although the thixotropic property can be quantified and evaluated from the obtained area of a hysteresis curve measured by a rheometer (measurement of the revolution dependence of the viscosity), it is simplest to evaluate the thixotropic property by the TI value measured by an ordinary viscometer. In the present invention, the thixotropy coefficient is expressed by $\eta 1/\eta 100$ which is a ratio of apparent viscosity ($\eta 1$) of the resin composition at a shear rate of 1 (rad/s) to the apparent viscosity ($\eta 100$) at 100 (rad/s).

The resin varnish preferably has a complex viscosity measured at a frequency of 1 rad/s of from 50,000 to 200,000 mPa·s. If the complex viscosity is higher than 200,000 mPa·s, the paste may remain in the mesh of the screen after the screen printing, and the detachment from the screen tends to be bad.

Therefore, it is preferred to adjust the thixotropy coefficient ($\eta 1/\eta 100$) of the polyimide resin composition of the present invention within the range from 1.5 to 10.0, more preferably from 1.8 to 8.0, still more preferably from 2.0 to 6.0. If the thixotropy coefficient is 1.5 or more, sufficient resolution may easily be obtained in the screen printing. On the other hand, if the thixotropy coefficient is 10.0 or lower, the ease of handling during printing is promoted.

The polyimide composition of the present invention preferably has a good wetting property to silicon wafers, ceramic substrates, glass substrates, glass epoxy substrates, metal substrates typified by Ni, Cu and Al substrates. That is, any of the contact angles at room temperature on the surface of any of silicon, $SiO_2$ film, polyimide resin, ceramic and metal is preferably 20° to 90°. If the contact angle is 90° or less, a uniform coating film free from blisters, cissing and pinholes can be obtained. If the contact angle is more than 90°, the resin paste is repelled, so that pinholes and defective patterning may occur. On the other hand, if the contact angle is less than 20°, sagging may occur during the leveling after coating, so that the precision of the patterning tends to be degraded, which is not preferred. The contact angle is defined as the angle between the tangent line and the substrate, which tangent line is drawn from the contact point when a drop of the resin paste is dropped on the substrate. The term "room temperature" mainly indicate a temperature of about 25° C. The contact angle of the composition can be adjusted by one or more of the composition of the polyimide resin, solvent, surfactant, antifoaming agent and leveling agent.

The polyimide resin composition of the present invention is for semiconductor devices. That is, the composition of the present invention is used for forming insulation films, protective films and the like contained in semiconductor devices. These polyimide films can be formed basically by coating the composition of the present invention on a base layer in a semiconductor device, and drying the composition to form a polyimide film. The cases where the film is formed on a lead frame or die pad are also within the scope of the use of the present invention.

As the coating method of the polyimide resin composition of the present invention, screen printing method, dispense method and ink jet method are preferred. Among these, screen printing method is most preferred because a large area can be coated in a short time. It is possible to form a film having a thickness of 2 µm or more after drying by one coating. In view of the reliability of insulation, it is preferred to attain a film thickness of at least 7 µm by one coating. Therefore, in screen printing method, it is preferred to carry out the screen printing using a mesh screen having a line diameter of 50 µm or less and a mesh size of not smaller than 3D-200 mesh, and using a squeegee made of a resin having a rubber hardness of not less than 70° and not more than 90°. The specification of the screen such as mesh diameter and number of mesh may appropriately be selected. By the dispense method, thin line can be drawn, and the line thickness after allowing the wet coating film to stand at room temperature for one day can be made within the range of ±20% from the line thickness immediately after coating. Further, by the ink jet method, thin line can be drawn, and the line thickness after allowing the wet coating film to stand at room temperature for one day can be made within the range of ±100% from the line thickness immediately after coating.

By performing leveling, vacuum drying and the final curing steps on the polyimide resin composition after printing, insulation films and protective films having excellent electric properties, heat resistance and chemical resistance can be obtained. The leveling is performed preferably for 15 minutes or more. Although the vacuum drying is preferably performed because good finishing of the coating film can be attained, in cases where a leveling agent or an antifoaming agent is added, vacuum drying may not be necessary. The curing temperature and time of the final curing step may be appropriately selected depending on the solvent of the polyimide resin composition and the thickness of the coated film.

The polyimide resin composition of the present invention can be used as a semiconductor stress buffer; interconnection dielectric; protective overcoat; bond pad redistributor; underfill of solder bump; and primary passivation layer or secondary passivation layer in power semiconductor devices, in packaging of wafer level or chip level. The concrete uses of the composition are not restricted and the composition may be used as insulation films, protective films, stress buffer films, heat resistant adhesives and various thermal printing inks in semiconductor devices including devices such as power devices, SAW filters, solar cells, monosilic ICs, hybrid ICs, thermal heads, image sensors and multichip high density packaging substrates; flexible wiring boards; and rigid wiring boards. Thus, the composition is very useful industrially.

Embodiments of the application of the polyimide composition of the present invention to the film formation in semiconductor devices will now be described.

An embodiment is a semiconductor device having REduced SURface Field (RESURF) structure as a part thereof, wherein the film formed from the polyimide resin composition of the present invention is formed such that it contacts one or a plurality of parts of a primary or secondary passivation formed at least on the RESURF structure. With high voltage lateral IGBTs having RESURF structure, the switching loss can be reduced by making the thickness of the wafer or chip small. However, if the wafer or the chip is made thin, distortion is likely to generate by the stress if the reflow temperature of the polyimide is high, so that there is a concern that deterioration of the quality of the product may be caused during die bonding or plastic molding. However, by applying the composition of the present invention, a semiconductor device in which the distortion of the chip due to thermal stress is reduced can be obtained.

Another embodiment is a semiconductor device having a first major surface and a second major surface, wherein a film made from the composition of the present invention is formed at least between a first electrode and a second electrode on the first major surface. It is known that in semiconductor memories, ICs and power devices having a plurality of electrode pads, polyimide is used as a buffer for the stress generated by molding. With the conventional polyimide for semiconductor devices, a pattern is formed by exposure and etching, and then imidization is conducted at a high temperature, so that the process is complicated and there are problems of warping of the wafer by the thermal stress and deterioration of wetting property of solder due to the contamination of the metal layer with a degas. By applying the composition of the present invention to such a semiconductor device, the distortion of the chip due to the thermal stress is reduced, and semiconductor devices in which deterioration of the product quality due to degas is small can be obtained inexpensively.

Still another embodiment is a semiconductor device having a first major surface and a second major surface, wherein a film made from the composition of the present invention is formed at least on the insulation film or semi-insulation film bridging a first electrode and a second electrode on the first major surface. By forming a semi-insulation film on the terminal of a high voltage power device, the withstand voltage can be stabilized. This is because that although when a device is molded, the mold material is polarized by the applied voltage and the polarization influences on the depletion of the silicon at the terminal portion, the influence can be reduced by the semi-insulation film. However, the thickness of this film is usually about 1 μm, and this thickness is insufficient when a withstand voltage of, for example, several thousand volts is required. Therefore, it is necessary to form an insulation film made of polyimide or the like having a thickness of, for example, 10 μm or more. If a thick polyimide film having a thickness of 10 μm or more is formed in the device produced by a conventional method, a problem of warping of the wafer due to the residual stress arises. Further, with the increase of the thickness of the coating insulation film, the influence by the degassing increases, which is also problematic. With the semiconductor device according to this embodiment to which the present invention is applied, a thick film with a thickness of 10 μm or more can be easily formed by adjusting the mesh size and the solid content of the polyimide ink. Further, since the pattern is formed from the beginning, the stress is dispersed, so that the wafer is hardly warped. Still further, a semiconductor device in which the deterioration of the quality due to degassing can be obtained.

Still another embodiment is a semiconductor device having a thickness between a first major surface and a second major surface of 250 μm or less. A technique for promoting the performance of a device by integrating semiconductor memory and IC in one package has been proposed. When this technique is applied, because of the limitation from the package, the thickness of the wafer or chip must be small. In this case, if the reflow temperature of the polyimide is high, distortion is likely to generate, so that there is a concern that the quality of the product may be deteriorated during die bonding or plastic molding. However, by applying the present invention to this embodiment of semiconductor device, a semiconductor device wherein the distortion of the chip due to thermal stress is reduced can be obtained inexpensively.

Still another embodiment is a semiconductor device having a thickness between a first major surface and a second major surface of 250 μm or less, which has an impurity-diffused layer made of the second major surface and a metal electrode contacting the second major surface. By making the thickness of the wafer or chip in IGBT small, the trade off relationship between the on-state power loss and switching loss can be improved. However, when the thickness of the wafer or chip is made small, if the reflow temperature of the polyimide used as the protective film is high, distortion is likely to be formed due to the stress, so that the product quality may be deteriorated during the die bonding or plastic molding. Further, due to degassing from the polyimide, the metal layer is contaminated, which causes the wetting property of the solder. With the semiconductor device of this embodiment to which the present invention is applied, the distortion of the chip due to thermal stress is reduced, and a semiconductor device in which the contamination of the metal layer is reduced can be obtained inexpensively.

Still another embodiment is a semiconductor device having a wafer (SOI wafer) in which a first semiconductor layer, a second insulation layer and a third semiconductor layer are joined each other via a major surface. Also another embodiment is this type of semiconductor device wherein one or more portions in the second insulation layer is selectively made hollow, or wherein the thickness of one or more portions in the second insulation layer is selectively made larger than other portions. SOI wafer is known to easily attain device isolation, and to reduce parasitic operation so as to reduce power consumption. Although lateral power devices such as IGBT using the SOI structure have been reported, the embedded oxide layer in these devices has a thickness of as large as several micrometers, so that there is a problem in that failure in transport may occur in the production apparatus due to the warping of the wafer. Also in cases where a polyimide film is formed as a protective film, the shape of warping is more complicated due to the film stress, so that there is a task to reduce the stress during the film formation. With the semiconductor device using an SOI wafer having a film made from the composition of the present invention, the warping of the wafer can be reduced and so failure in transport can be reduced, so that stable production can be attained.

Still another embodiment is a semiconductor device wherein the semiconductor layer is made of SiC, GaN or diamond. Wide band gap semiconductors such as silicon carbide, GaN or diamond has a high intrinsic temperature, so that semiconductor devices using them can be used at a temperature of 175° C. or higher, which is higher than the temperature at which silicon can be used. Further, since the critical field is high, the distance of the potential separation portion can be made smaller than in the devices using silicon, so that the chip area can be reduced, accordingly. However, in this case, the electric intensity at the potential separation portion is high. As the protective layer at the interface between the semiconductor element and the mold material, which is subjected to high temperature and high electric field, polyimide is most preferred. By applying the present invention to this embodiment of semiconductor device, a semiconductor device having polyimide with excellent heat resistance and high withstand voltage can be provided at a lower cost than by the conventional technique.

Still another embodiment is a semiconductor device having a light-receiving or power generation function. In the semiconductor elements which receive sun light and convert it to electric energy, polyimide may be used as the stress buffer. With the semiconductor device according to this embodiment to which the present invention is applied, since the polyimide film can be formed at a temperature lower than in the conventional technique, the distortion of the semiconductor element due to thermal stress can be reduced, so that a semiconductor device having a high quality can be obtained inexpensively. This is also true for light-emitting semiconductor elements.

Still another embodiment is a semiconductor device wherein an insulation film is used as an optical waveguide. A semiconductor device wherein a thick oxide layer with a thickness of 20 μm is formed on the semiconductor substrate, and the oxide layer is used as an optical waveguide. Similar to the cases mentioned above, when polyimide is used as a protective layer, there is a task of reducing the warping of the wafer. With the semiconductor devices using the oxide film as an optical waveguide, by using the polyimide composition of the present invention, the warping of the wafer can be reduced, so that stable production can be attained.

Still another embodiments are a semiconductor device having a function to convert the received pressure to electric signals; a semiconductor device having a function to convert the received vibration to electric signals; a semiconductor device having a function to convert velocity to electric signals; a semiconductor device having a function to convert acceleration to electric signals; and a semiconductor device having a function to convert sensed magnetic field to electric signals. In recent years, various MEMS (Micro Electro Mechanical Systems) devices have been reported, wherein machine elements, sensors, actuators and electronic circuits are integrated on one semiconductor substrate. Although these devices are produced by semiconductor IC production techniques, since deep etching is required for forming the three dimensional shape and operation structure, the semiconductor substrate must be thin. Therefore, warping of the wafer and the like are problematic as in the cases mentioned above in the section of the semiconductor device having a thickness between the first major surface and the second major surface of 250 μm or less. With the semiconductor devices according to this embodiment to which the present invention is applied, reduction of warping of the wafer can be attained, and stable production of these semiconductor devices can be attained.

EXAMPLES

The production processes of the polyimide compositions used in the present invention and their characteristics will now be described concretely by way of examples. Since polyimides having various properties can be obtained depending on the combination of the acid dianhydrides and the diamines, the present invention is not restricted to these Examples.

Synthesis Example 1

To a 2 L three-necked separable flask equipped with a stainless steel anchor agitator, and a condenser comprising a trap for water separation and a cooling tube having balls were attached. To the flask, were added 71.66 g (200 mmol) of 3,3',4,4'-biphenylsulfone tetracarboxylic dianhydride (DSDA), 24.85 g (100 mmol) of 1,3-bis(3-aminopropyl)tetramethyldisiloxane (PAM-E), 65 g of methyl benzoate (BAME), 98 g of tetraglyme, 4.0 g of γ-butyrolactone, 6.3 g of pyridine and 50 g of toluene. After stirring the mixture at room temperature under a nitrogen atmosphere at 180 rpm for 30 minutes, the mixture was heated to 180° C. and stirred at this temperature for 1 hour. During the reaction, toluene-water azeotrope was removed. The mixture was then cooled to room temperature, and 71.66 g (200 mmol) of DSDA, 48.04 g (150 mmol) of 4,4'-diamino-2,2'-ditrifluoromethyl-1,1'-biphenyl (TFMB), 61.58 g (150 mmol) of 2,2-bis[4-(4-aminophenoxy)phenyl]propane (BAPP), 130 g of BAME, 196 g of tetraglyme and 50 g of toluene were added. The mixture was allowed to react for 4 hours at 180° C. with stirring at 180 rpm. By removing the refluxed materials, a polyimide solution with a concentration of 35% by weight was obtained.

Synthesis Example 2

The same apparatus as used in Synthesis Example 1 was used. To the flask, 49.64 g (160 mmol) of bis-(3,4-dicarboxyphenyl)ether dianhydride (ODPA), 19.88 g (80 mmol) of PAM-E, 93 g of BAME, 62 g of tetraglyme, 4.0 g of γ-valerolactone, 6.3 g of pyridine and 50 g of toluene were added. After stirring the mixture at room temperature under a nitrogen atmosphere at 180 rpm for 30 minutes, the mixture was heated to 180° C. and stirred at this temperature for 1 hour. During the reaction, toluene-water azeotrope was removed. The mixture was then cooled to room temperature, and 74.45 g (240 mmol) of ODPA, 59.23 g (170 mmol) of 9,9'-bis(4-aminophenyl)fluorene (FDA), 61.58 g (150 mmol) of BAPP, 186 g of BAME, 124 g of tetraglyme and 50 g of toluene were added. The mixture was allowed to react for 3 hours at 180° C. with stirring at 180 rpm. By removing the refluxed materials, a polyimide solution with a concentration of 35% by weight was obtained.

Synthesis Example 3

The same apparatus as used in Synthesis Example 1 was used. To the flask, 143.31 g (400 mmol) of DSDA, 73.25 g (200 mmol) of 2,2-bis(3-amino-4-hydroxyphenyl)hexafluoropropane, 82.10 g (200 mmol) of BAPP, 211 g of BAME, 317 g of tetraglyme, 4.0 g of γ-valerolactone, 6.3 g of pyridine and 100 g of toluene were added. After stirring the mixture at room temperature under a nitrogen atmosphere at 180 rpm for 30 minutes, the mixture was heated to 180° C. and stirred at this temperature for 3 hours. By removing the refluxed materials, a polyimide solution with a concentration of 35% by weight was obtained.

Synthesis Comparative Example 1

The same apparatus as used in Synthesis Example 1 was used. To the flask, 62.04 g (200 mmol) of ODPA, 24.85 g (100 mmol) of PAM-E, 156 g of ethyl benzoate, 67 g of γ-butyrolactone, 6.0 g of γ-valerolactone, 9.5 g of pyridine and 50 g of toluene were added. After stirring the mixture at room temperature under a nitrogen atmosphere at 180 rpm for 30 minutes, the mixture was heated to 180° C. and stirred at this temperature for 1 hour. During the reaction, toluene-water azeotrope was removed. The mixture was then cooled to room temperature, and 124.09 g (400 mmol) of ODPA, 82.10 g (200 mmol) of BAPP, 87.70 g (300 mmol) of 1,3-bis(3-aminophenoxy)benzene (APB), 311 g of ethyl benzoate, 133 g of γ-butyrolactone and 50 g of toluene were added. The mixture was allowed to react at 180° C. with stirring at 180 rpm for 3 hours. By removing the refluxed materials, a polyimide solution with a concentration of 35% by weight was obtained.

2. Preparation of Compositions

Compositions containing each one of the polyimides obtained as described above, respectively, were prepared. As the organic solvent (A), methyl benzoate was used, and as the organic solvent (B), tetraglyme was used. The specific composition of the prepared compositions is described below. The vapor pressures of the organic solvent (A) and the organic solvent (B) at room temperature are 0.38 mmHg (25° C.) and 0.01 mmHg or lower (20° C.), respectively. The evaporation rates are 2256.3 mg/min/m² and 71.6 mg/min/m², respectively. The solubilities of the polyimides used in the present invention were larger in the organic solvent (A) than in the organic solvent (B). Thus, the solubility of the polyimide is lower in the solvent having a lower evaporation rate, which is preferred.

Composition of Polyimide Resin Compositions

| Polyimide | 35% by weight |
| Methyl benzoate (organic solvent (A)) | 26-39% by weight |
| Tetraglyme (organic solvent (B)) | 26-39% by weight |

3. Film Formation

Films were formed on a substrate using the above-described compositions, respectively. The substrate was a silicon wafer and each composition was coated by screen printing method. As for the specific coating conditions, the printing was performed using 3D-200 mesh and a squeegee having a hardness of 80°, at an attack angle of 70°, with a clearance of 2.5 mm, under a printing pressure of 0.1 MPa at a printing rate of 10 mm/sec. Each coating film was dried to form a polyimide film. The drying was performed by conducting leveling for 30 minutes, heating under a nitrogen atmosphere at 140° C. for 60 minutes, and then at 250° C. for 30 minutes under the same atmosphere. The film thickness after drying was 10 µm.

4. Evaluation

The properties of the above-described polyimides, compositions and formed films were evaluated. The evaluations were carried out as follows:

(a) Molecular Weight

The number average molecular weight Mn of the polyimide was measured by gel permeation chromatography (GPC) using HLC-8220GPC (commercially available from Tosoh Corporation). As the column, TSKgel GMH$_{HR}$-H commercially available from Tosoh Corporation was used. As the carrier solvent, LiBr solution in DMF at a concentration of 0.1N was used. The molecular weight is one calculated using standard polystyrenes (TSK standard polystyrenes).

(b) Thermal Properties

Thermal decomposition initiation temperature of the polyimide resin was measured by DuPont 951 thermogravimetry apparatus.

(c) Mechanical Properties

Mechanical properties of the polyimide were measured as follows: That is, the polyimide composition was coated by screen printing on a copper foil F2-WS (18 µm) commercially available from Furukawa Circuit Foil Co., Ltd., to a thickness after drying of 15±2 µm, and the thus obtained thin film was heated at 120° C. for 60 minutes and then at 180° C. for minutes, thereby attaining drying and heat treatment, followed by removal of the copper foil by etching. The thus obtained polyimide resin film was measured for breaking strength, tensile elongation and initial elastic modulus by a universal tensile tester (Tensilon UTM-11-20, commercially available from Orientec).

(d) Viscosity and thixotropy coefficient were measured using Rheometer RS300 commercially available from Thermo Haake. More particularly, the measurements were carried out as follows: That is, after adjusting the temperature of a plate (stationary part) to 25±0.1° C., a sample in an amount of 1.0 g to 2.0 g was placed thereon. A cone (movable part) was moved to a prescribed position and the resin solution was held until the temperature thereof reached 25±0.1° C., under the condition such that the resin solution was sandwiched between the plate and the cone. Then the cone was started to revolute, and the revolution rate was gradually increased such that the shear rate reached to 1 rad/s in 30 seconds. This revolution velocity was kept and the viscosity after one minute was read. The revolution rate was further increased such that the shear rate reached 100 rad/s from 1 rad/s in one minute, and the viscosity at 100 rad/s was read. The thus obtained value at the 100 rad/s was defined as the viscosity, and the ratio of the value at 100 rad/s to the value at 1 rad/s was defined as the thixotropy coefficient.

(e) The contact angle was measured using a contact angle meter CA-VP type commercially available from Kyowa Interface Science Co., Ltd. More specifically, 1 µL of resin solution was dropped on a substrate, and 30 seconds later, the contact angle was read.

(f) Printing property was evaluated by carrying out printing on the entire surface of a 6-inch silicon wafer using a printer LS-34TVA commercially available from Newlong Seimitsu Kogyo Co., Ltd. and a screen ST400-3D mesh commercially available from Tokyo Process Service Co., Ltd., and the number of cissing was counted by visual observation.

(g) Continuous printing property was evaluated as follows: Printing was performed using the apparatuses used in (f) described above. After carrying out the printing three times, the printing was stopped for 20 minutes. The printing was started again and the compositions with which the film thickness reached to the same thickness as that obtained before stopping within three times were evaluated as good (expressed as "○" in Table 1). The symbol "Δ" in Table 1 indicates that the printing property was not good, and the symbol "x" in Table 1 indicates that the printing property was bad.

(h) Adhesion with the substrate was evaluated by the cross cut method according to JIS K5600-5-6.

TABLE 1

| Items | Unit | Example 1 | Example 2 | Example 3 | Comparative Example 1 |
|---|---|---|---|---|---|
| Glass transition temperature (Tg) | ° C. | 219 | 201 | 274 | 155 |
| Thermal decomposition temperature (Td5%) | ° C. | 469 | 500 | 449 | 488 |
| Breaking strength | MPa | 107 | 136 | 108 | 102 |

TABLE 1-continued

| Items | | Unit | Example 1 | Example 2 | Example 3 | Comparative Example 1 |
|---|---|---|---|---|---|---|
| Tensile elongation | | % | 12.2 | 14.3 | 6.5 | 7.7 |
| Elastic modulus | | GPa | 2.6 | 2.5 | 3.0 | 2.9 |
| Viscosity | | mPa·s | 53,000 | 48,000 | 44,000 | |
| Thixotropic Coefficient | | — | 3.6 | 2.4 | 3.4 | |
| Contact angle | SiO$_2$ substrate | ° | 29.5 | 66.4 | 97.4 | 68.2 |
| | SiN substrate | | 32.5 | 68.7 | 103.9 | 69.4 |
| Printing Property | cissing | | 0 | 0 | 0 | 0 |
| Continuous Printing Property | | | ○ | ○ | ○ | X |
| Adhesion (to SiO$_2$) | | | ○ | ○ | ○ | ○ |
| Adhesion (to SiN) | | | ○ | ○ | Δ | ○ |

The invention claimed is:

1. A method of forming a polyimide film in a semiconductor device, said method comprising coating a base layer in said semiconductor device with a composition comprising:
a mixed solvent of a first organic solvent (A) which is a hydrophobic solvent having a vapor pressure at room temperature of 1 mmHg or lower and a second organic solvent (B), which is a hydrophilic solvent having a vapor pressure at room temperature of 1 mmHg or lower; and
a polyimide resin made from a tetracarboxylic dianhydride and a diamine, said polyimide resin having, in its main chain, a divalent group represented by the following formula [I]

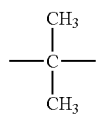
[I]

and at least one divalent group selected from the group consisting of a divalent group represented by the following formula [II] and a divalent group represented by the following formula [IV]

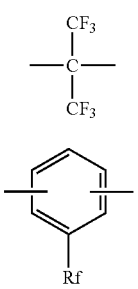
[II]

[IV]

wherein Rf represents a $C_1$-$C_4$ perfluoroalkyl group, said polyimide resin being dissolved in said mixed solvent, wherein the percentage of the components having at least one divalent group selected from the group consisting of a divalent group represented by formula [II] and a divalent group represented by formula [IV] is from 20 mol % to 60 mol % based on the tetracarboxylic dianhydride components and diamine components constituting the polyimide,
wherein said composition has a thixotropy coefficient of from 1.5 to 10.0.

2. The polyimide film-forming method of claim 1, wherein said polyimide resin in said composition has a glass transition temperature of 150° C. or higher.

3. The polyimide film-forming method of claim 1, wherein said composition has a viscosity of 20,000 to 200,000 mPa·s at a shear rate of from 1 to 100 s$^{-1}$.

4. The polyimide film-forming method of claim 1, wherein said composition has a contact angle of from 20° to 90° at room temperature on a surface of any of silicon, SiO$_2$ film, polyimide resin, a ceramic and a metal.

5. The method according to claim 1, wherein said polyimide film is formed by screen printing method, ink jet method or dispense method.

6. The method according to claim 1, wherein a polyimide film having a thickness of 2 μm or more after drying is formed by one coating.

7. The method according to claim 1, wherein said polyimide film is used as at least one selected from the group consisting of semiconductor stress buffers; interconnection dielectrics; protective overcoats; bond pad redistributors; underfills of solder bump; and primary passivation layers and secondary passivation layers in power semiconductor devices, in packaging of wafer level or chip level.

8. A semiconductor device comprising the polyimide film formed by the method according to any one of claims 1 to 7.

9. The method according to claim 1, wherein said first organic solvent (A) is methyl benzoate and said second organic solvent (B) is tetraglyme.

* * * * *